(12) United States Patent
Simin et al.

(10) Patent No.: US 8,339,163 B2
(45) Date of Patent: Dec. 25, 2012

(54) FIELD EFFECT TRANSISTOR WITH INTEGRATED GATE CONTROL AND RADIO FREQUENCY SWITCH

(75) Inventors: Grigory Simin, Columbia, SC (US); Alexei Koudymov, Troy, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 193 days.

(21) Appl. No.: 12/791,272

(22) Filed: Jun. 1, 2010

(65) Prior Publication Data

US 2010/0301922 A1     Dec. 2, 2010

Related U.S. Application Data

(60) Provisional application No. 61/217,527, filed on Jun. 1, 2009.

(51) Int. Cl.
*H03K 3/00* (2006.01)
(52) U.S. Cl. .......................... 327/108; 327/565; 327/566
(58) Field of Classification Search .................. 327/108, 327/565, 566
See application file for complete search history.

(56) References Cited

U.S. PATENT DOCUMENTS

| | | | | |
|---|---|---|---|---|
| 4,733,203 A | * | 3/1988 | Ayasli | 333/139 |
| 4,843,358 A | * | 6/1989 | Meise et al. | 333/263 |
| 7,417,473 B2 | * | 8/2008 | Kawamoto | 327/108 |
| 7,688,158 B2 | * | 3/2010 | Rohani et al. | 333/25 |
| 7,898,303 B2 | * | 3/2011 | Barrenscheen | 327/108 |

OTHER PUBLICATIONS

Koudymov et al., "Monolithically Integrated High-Power RF Switch Based on III-N Insulated Gate Transistors", IEEE Microwave and Wireless Components Lett., vol. 14, Issue: 12, 560-562 (2004).
Yang et al., "High-Power Operation of III-N MOSHFET RF Switches", IEEE Microwave and Wireless Components Lett., V. 15, 850-852 (2005).

* cited by examiner

*Primary Examiner* — Kenneth B. Wells
(74) *Attorney, Agent, or Firm* — John W. LaBatt; Hoffman Warnick LLC

(57) ABSTRACT

A field effect transistor (FET) including a monolithically integrated gate control circuit element can be included in, for example, a radio frequency switch circuit. For example, the FET can be included as a series and/or shunt FET of a radio frequency coplanar waveguide circuit. The widths of the series and shunt FETs of a switch circuit can be selected to provide a target isolation and/or a target insertion loss for a target operating frequency.

20 Claims, 6 Drawing Sheets

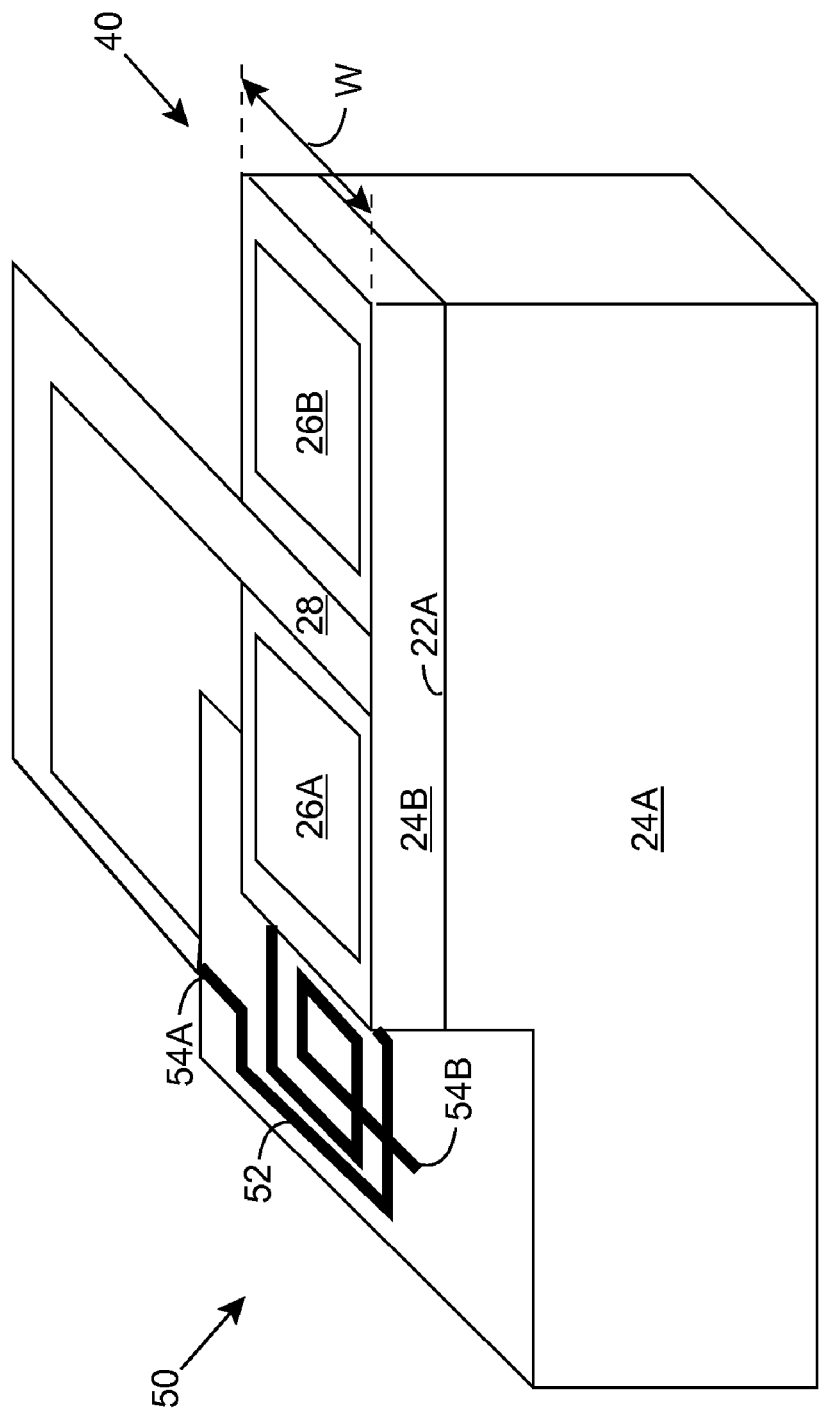

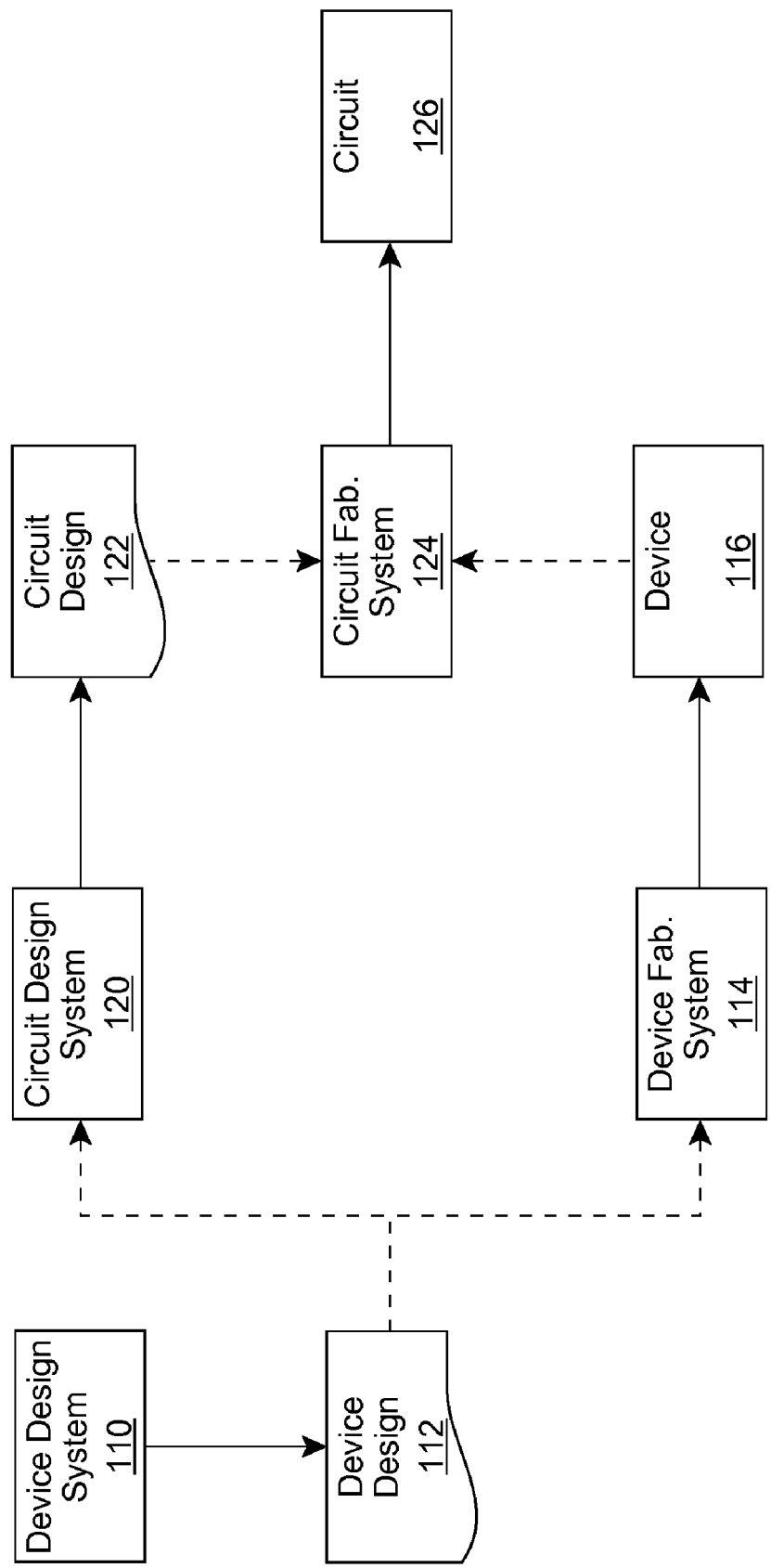

FIELD EFFECT TRANSISTOR WITH INTEGRATED GATE CONTROL AND RADIO FREQUENCY SWITCH

REFERENCE TO PRIOR APPLICATION

The current application claims the benefit of U.S. Provisional Application No. 61/217,527, titled "Integrated radio-frequency field-effect transistor switch", which was filed on 1 Jun. 2009, and which is hereby incorporated by reference.

TECHNICAL FIELD

The disclosure relates generally to field effect transistors, and more particularly, to a field effect transistor with a monolithically integrated gate control circuit element.

BACKGROUND ART

Solid state radio frequency (RF) switches are important components of radar transmit/receive (T/R) modules, satellite communication systems, Joint Tactical Radio Systems (JTRS), and the like. A promising RF switch technology uses Heterostructure Field Effect Transistors (HFETs). Recently, high power switches made of AlGaN/GaN HFETs demonstrated superior performance over other RF switching devices in terms of maximum power density, bandwidth, operating temperature, and breakdown voltage.

Many applications, including JTRS and low-noise receivers, require RF switches with a very low insertion loss, e.g., typically below 0.1 dB. A low loss switch dissipates little RF power. As a result, it can be fabricated over a low cost substrate, such as sapphire. Low insertion loss in an HFET is due to a high channel conductance of the device, which is proportional to a total length of the device periphery. Exceptionally high 2D electron gas densities at the AlGaN/GaN interface make a group III-Nitride HFET with a total periphery of two to five mm an ideal candidate for RF switching applications.

The feasibility of high-power broad-band monolithically integrated group III-Nitride HFET RF switches has been demonstrated. Large signal analysis and experimental data for a large periphery group III-Nitride switch indicate that the switch can achieve switching powers exceeding +40 to +50 dBm. The design of a driving/control circuit is an important consideration for achieving high power switching. In general, the driving/control circuit should provide fast response to control pulses, while providing good isolation for the signal being switched. To this extent, the impedance of the driving/control circuit must be much lower than the gate-to-channel impedance of the HFET at high frequencies. Therefore, it is often important for each of the HFET's gates to be connected to the control signal supplies through a low-pass filter, which for robustness and cost efficiency can be monolithically integrated with each HFET.

SUMMARY OF THE INVENTION

Aspects of the invention provide a field effect transistor (FET) including a monolithically integrated gate control circuit element can be included in, for example, a radio frequency switch circuit. For example, the FET can be included as a series and/or shunt FET of a radio frequency coplanar waveguide circuit. Additional aspects of the invention provide for the selection of the widths of the series and shunt FETs of a switch circuit to provide a target isolation and/or a target insertion loss for a target operating frequency. To this extent, one or more aspects of the invention can be directed to providing a solution for designing and/or fabricating a high power, low loss radio frequency switch circuit.

A first aspect of the invention provides a switch circuit comprising: a field effect transistor (FET); a gate control circuit for operating the FET, wherein the gate control circuit includes a gate control circuit element monolithically integrated with the FET; and a low-pass filter formed using the gate control circuit element.

A second aspect of the invention provides a method comprising: designing a switch circuit, the switch circuit including a series field effect transistor (FET) and a shunt FET, the designing including: selecting a FET comprising a monolithically integrated gate control element for implementing at least one of: the series FET or the shunt FET, wherein a low-pass filter is formed using the monolithically integrated gate control element; and electrically connecting an input signal to an input of the monolithically integrated gate control element, wherein the input signal comprises one of: an output signal of a second gate control element of a gate control circuit or an input signal for the gate control circuit.

A third aspect of the invention provides a device comprising: a field effect transistor (FET) comprising a gate; and a circuit monolithically integrated with the gate of the FET, wherein a low-pass filter is formed using the monolithically integrated circuit.

Other aspects of the invention provide methods, systems, program products, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3 shows another illustrative FET with a monolithically integrated gate control circuit element according to an embodiment.

FIG. 6 shows an illustrative flow diagram for fabricating a circuit according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a field effect transistor (FET) including a monolithically integrated gate control circuit element can be included in, for example, a radio frequency switch circuit. For example, the FET can be included as a series and/or shunt FET of a radio frequency coplanar waveguide circuit. Additional aspects of the invention provide for the selection of the widths of the series and shunt FETs of a switch circuit to provide a target isolation and/or a target insertion loss for a target operating frequency. To this extent, one or more aspects of the invention can be directed to providing a solution for designing and/or fabricating a high power, low loss radio frequency switch circuit. As used herein, unless otherwise noted, the term "set" means one or more (i.e., at least one) and the phrase "any solution" means any now known or later developed solution.

Figure 1:
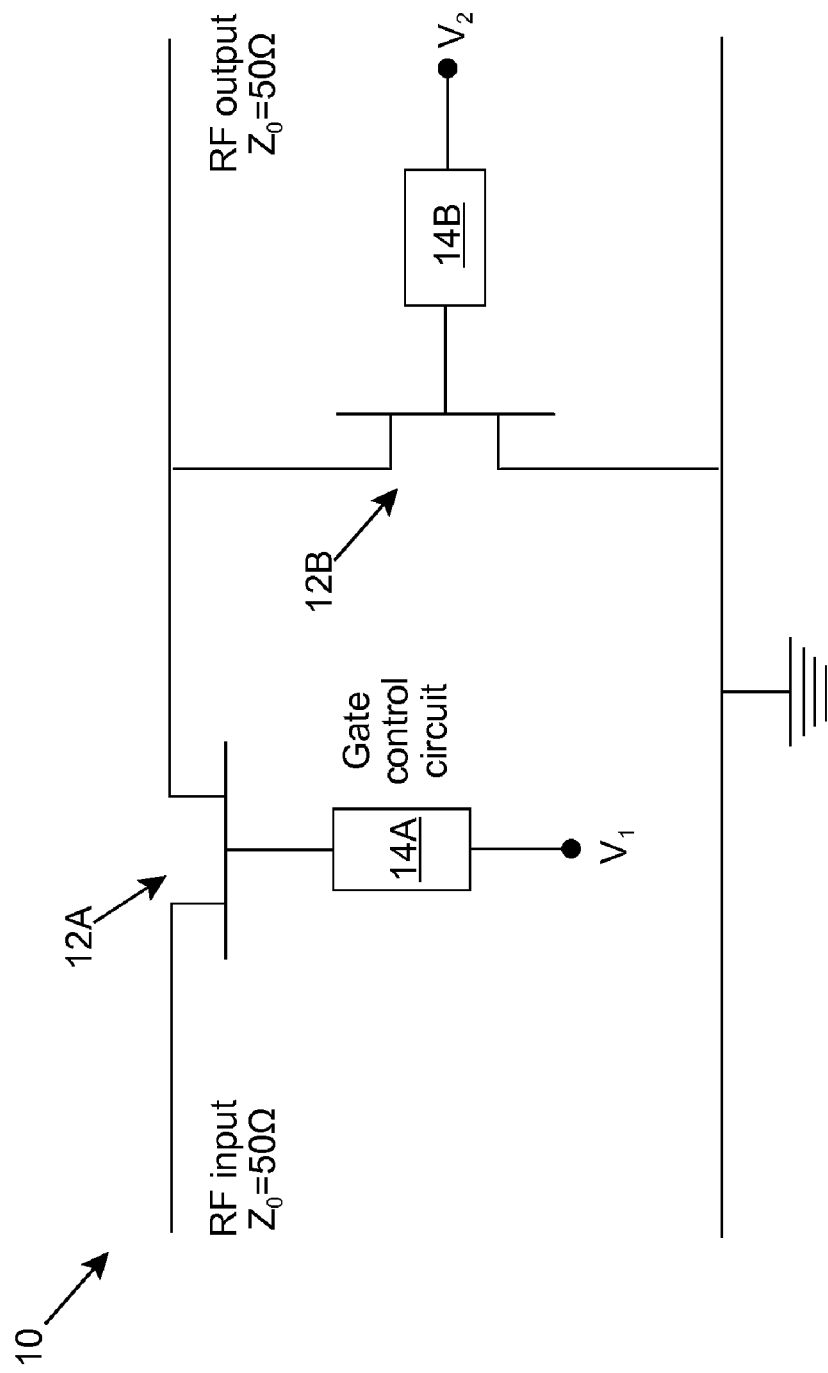
FIG. 1 shows an illustrative RF coplanar waveguide circuit according to an embodiment.

Turning to the drawings, FIG. 1 shows an illustrative radio frequency (RF) coplanar waveguide circuit 10 according to an embodiment. Circuit 10 includes a series FET 12A and a shunt FET 12B, each of which is configured to operate as a RF switch. To this extent, circuit 10 can operate as an integrated RF switch. As illustrated, series FET 12A is electrically connected between an input signal electrode and an output signal electrode of circuit 10, while shunt FET 12B is electrically connected between the signal and the ground electrode for the circuit 10. Series FET 12A includes a gate that is controlled by an output of a gate control circuit 14A. Similarly, shunt FET 12B includes a gate that is controlled by an output of a gate control circuit 14B. While shown including a single series FET 12A and shunt FET 12B, it is understood that circuit 10 can include two or more series FETs 12A and/or two or more shunt FETs 12B.

Each FET 12A, 12B can be fabricated using any solution. In an embodiment a FET 12A, 12B comprises a heterostructure FET (HFET), in which a device channel (e.g., a two-dimensional device channel) is formed at an interface of two structures. In a more particular embodiment, each FET 12A, 12B comprises a high power HFET. The structures of the HFET can include any number of one or more layers of materials selected from any now known or later developed material system, which will form such a device channel. For example, the structures can comprise one or more layers of materials selected from the group-III nitride material system (e.g., $Al_XIn_YGa_{1-X-Y}N$, where $0 \leq X, Y \leq 1$, and $X+Y \leq 1$ and/or alloys thereof) deposited on any type of substrate (e.g., sapphire). Similarly, the structures can comprise one or more layers of materials selected from the group-III arsenide material system (e.g., $Al_XGa_{1-X}As$, where $0 \leq X \leq 1$ and/or alloys thereof). In a particular embodiment, the HFET comprises an AlGaN/GaN compound semiconductor.

Regardless, each FET 12A, 12B can comprise any variation of FET now known or later developed, such as a junction FET, an insulated gate FET, a metal semiconductor FET, a metal oxide semiconductor FET, a metal insulator semiconductor FET, a high electron mobility transistor, a double heterostructure FET, etc. In an illustrative embodiment, one or both FETs 12A, 12B comprises an insulated gate HFET with a dielectric material between the gate and the semiconductor barrier layer. The dielectric material can comprise any type of uniform or composite dielectric layers. For example, the dielectric material can include oxygen containing dielectric materials (e.g., $SiO_2$, $HfO_2$, or the like), a SiN compound (e.g., SiN, $Si_3N_4$), and/or the like.

In an embodiment, at least a portion of at least one of the gate control circuits 14A, 14B is monolithically integrated with a gate of the corresponding FET 12A, 12B, respectively. Additionally, the monolithically integrated portion of the gate control circuit 14A, 14B can form a low-pass filter. The low-pass filter can be formed using the monolithically integrated portion of the gate control circuit alone, the monolithically integrated portion of the gate control circuit in series with the gate-to-channel capacitance of the FET 12A, 12B, and/or the like. In this manner, the resulting RF switch circuit can provide low loss, high isolation, and high power operating characteristics as compared to similar prior art switch circuits. For example, an RF switch circuit 10 can be fabricated using group-III nitride-based HFETs 12A, 12B to provide high-power, low-loss RF switching for a circuit/device.

Figure 2:
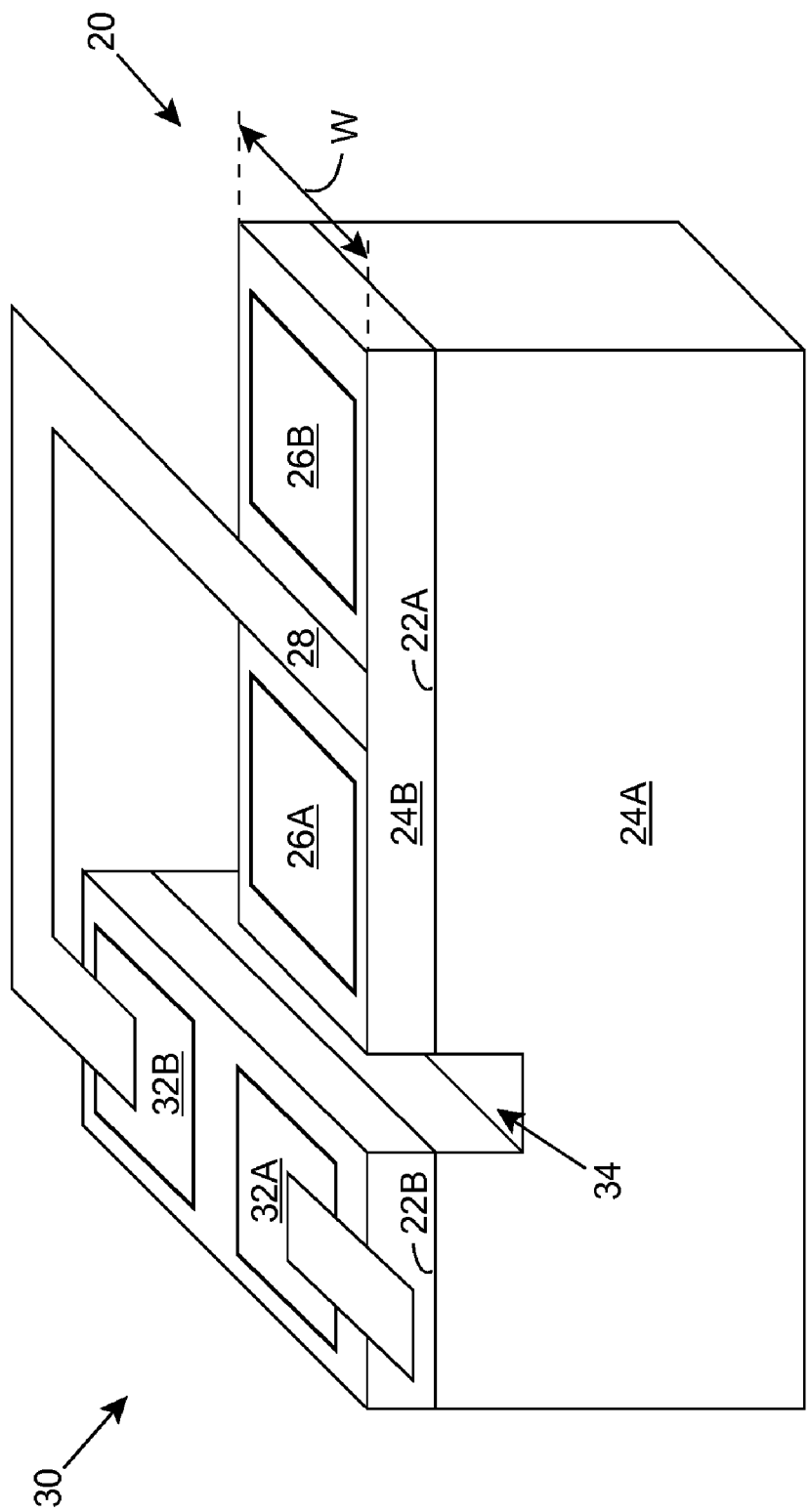
FIG. 2 shows an illustrative FET with a monolithically integrated gate control circuit element according to an embodiment.

FIG. 2 shows an illustrative FET 20 with a monolithically integrated gate control circuit element 30 according to an embodiment. As illustrated, FET 20 can comprise a HFET with a channel 22A formed at an interface of a pair of layers 24A, 24B. Furthermore, FET 20 can include a pair of contacts 26A, 26B to the channel 22A. Based on a configuration of FET 20 in a circuit, a contact, such as contact 26A, can comprise a source contact while the other contact, such as contact 26B, can comprise a drain contact. FET 20 also includes a gate 28, which can be operated using a gate control circuit element 30 to selectively allow the flow of current along the channel 22A between contacts 26A, 26B.

Gate control circuit element 30 is shown including a pair of contacts 32A, 32B to an ungated portion of the semiconductor channel 22B of the FET 20. To this extent, gate control circuit element 30 can comprise an integrated resistor. The ungated portion of the semiconductor channel 22B can be isolated from the remainder of the semiconductor channel 22A by, for example, a mesa structure 34. In an embodiment, each contact 32A, 32B comprises a Schottky contact to the channel 22B. As illustrated, contact 32B is monolithically integrated with the gate 28 of FET 20. Contact 32A can be electrically connected to a signal provided by another element of the gate control circuit for the gate 28 or an input signal for the gate control circuit.

FIG. 3 shows another illustrative FET 40 with a monolithically integrated gate control circuit element 50 according to an embodiment. Similar to FET 20 (FIG. 2), FET 40 can comprise a HFET with a channel 22A formed at an interface of a pair of layers 24A, 24B. Furthermore, FET 40 can include a pair of contacts 26A, 26B to the channel 22A. Based on a configuration of FET 40 in a circuit, a contact, such as contact 26A, can comprise a source contact while the other contact, such as contact 26B, can comprise a drain contact. FET 40 also includes a gate 28, which can be operated using a gate control circuit element 50 to selectively allow the flow of current along the channel 22A between contacts 26A, 26B. Gate control circuit element 50 comprises an on-ship spiral inductor 52, which comprises a first end 54A monolithically integrated with the gate 28. Additionally, a second end 54B of the spiral inductor 52 can be electrically connected to a signal provided by another element of the gate control circuit for the gate 28 or an input signal for the gate control circuit.

The designs of FETs 20, 40 of FIGS. 2 and 3 provide robust designs that do not require additional processing steps to form either FET 20, 40 with the monolithically integrated gate control circuit element 30, 50, respectively, over those required for a typical HFET formation process sequence. For example, the mesa structure 34 of the gate control circuit element 30 can be etched and the ohmic contacts 32A, 32B can be added during similar steps when forming the transistor channel 22A and the source and drain contacts 26A, 26B. Similarly, spiral inductor 52 of the gate control circuit element 50 can be formed during similar steps of the formation of FET 40.

Each gate control circuit element 30, 50 can be included as part of a low pass filter. For example, a low pass filter can be formed using gate control circuit element 30 by, for example, adding a planar integrated inductor in series with the resistor formed by gate control circuit element 30. Similarly, the integrated spiral inductor 52 of the gate control circuit element 50 can form a low pass filter. In each case, the spiral inductor comprises an impedance that is proportional to the frequency. As a result, the low pass filter can provide isolation at high frequency operation of a control circuit from operation of a switching circuit for the respective FET 20, 40. The incorporation of integrated gate control circuit elements 30, 50 can, for example, eliminate parasitic parameters, thereby expanding an operating frequency range for the corresponding FET 20, 40, and a corresponding circuit 10 (FIG. 1) as a result. Additionally, the integrated gate control circuit element 30, 50 can increase reliability of the corresponding FET 20, 40 and reduce the overall size and weight of the circuit 10.

One or more attributes of FETs 20, 40 can be selected based on one or more desired performance characteristics for the FET 20, 40 and/or a corresponding circuit. For example, each FET 20, 40 is shown having a corresponding width, W. Returning to FIG. 1, in an embodiment, a relation between a width, $W_{SER}$, of the series FET 12A and a width, $W_{SHUNT}$, of the shunt FET 12B is selected to provide a minimal insertion loss for a target isolation and/or target operating frequency for the circuit 10. A dependence of an insertion loss and an isolation for circuit 10 can be determined for a width $W_{SER}$ of the series FET 12A for different widths $W_{SHUNT}$ of the shunt FET 12B. The dependencies can be simulated, for example, using a model for each FET 12A, 12B used to fabricate the circuit 10. In an embodiment, each FET 12A, 12B comprises a HFET, such as an AlGaN/GaN HFET.

Figure 4A:
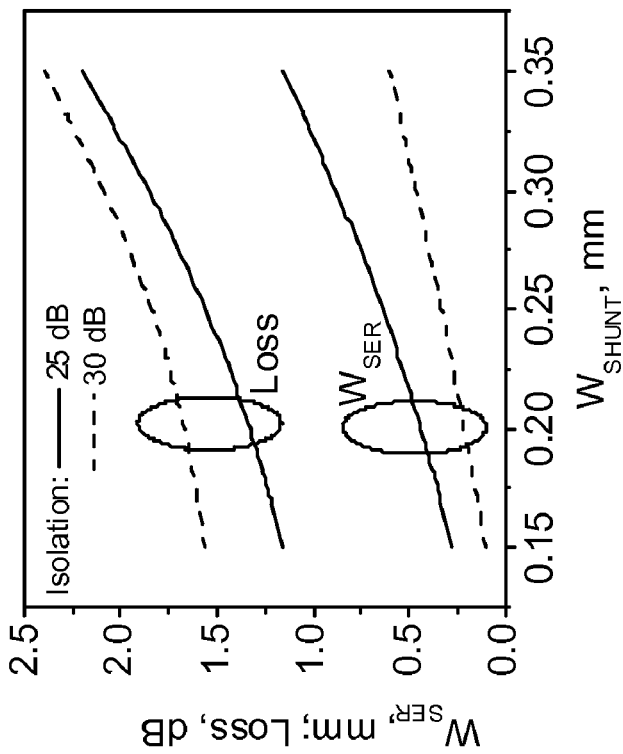
FIGS. 4A and 4B show illustrative simulated dependencies according to an embodiment.
Figure 4B:
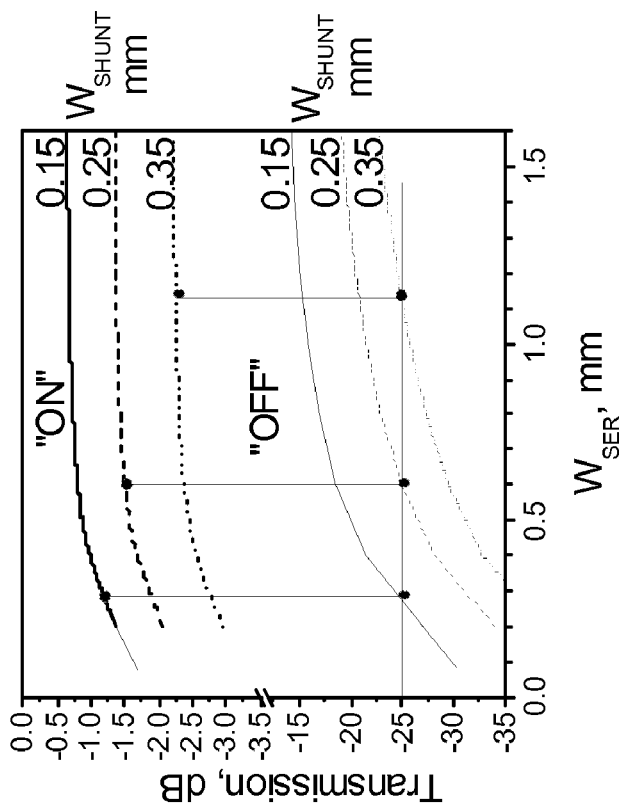

FIGS. 4A and 4B show illustrative simulated dependencies according to an embodiment. In FIGS. 4A and 4B, the dependencies were simulated using models for AlGaN/GaN HFETs 12A, 12B with 1 micron (μm) long gates operating at a frequency of ten gigahertz (GHz). FIG. 4A includes a set of insertion loss ("ON") and isolation ("OFF") plots for the $W_{SER}$ for each of three illustrative values for $W_{SHUNT}$, 0.15, 0.25, and 0.35 millimeters (mm). FIG. 4B includes a set of width $W_{SER}$ and insertion loss plots as a function of the width $W_{SHUNT}$ for two illustrative isolations (25 and 30 dB), which can be derived from the plots of FIG. 4A.

A designer can select a target isolation (e.g., 25 decibels (dB) in FIG. 4A) and one of the illustrative widths $W_{SHUNT}$. Using the simulated dependency plots in FIG. 4A, the designer can identify a width $W_{SER}$ that corresponds with the selected width $W_{SHUNT}$ for the target isolation, e.g., by finding the intersection of a plot corresponding to one of a 0.15, 0.25, or 0.35 mm $W_{SHUNT}$ with the target isolation (as indicated by the horizontal line corresponding to the target isolation).

Additionally, the designer can use the plots in FIG. 4A to identify an insertion loss achievable with the $W_{SER}$ and $W_{SHUNT}$ combination. For example, the designer can find an intersection of the identified width $W_{SER}$ with the insertion loss plot corresponding to the selected width $W_{SHUNT}$, e.g., by moving vertically (as indicated by the vertical line) from the intersection of the selected $W_{SHUNT}$ width with the target isolation. The achievable insertion loss corresponds to the intersection with the insertion loss plot.

It is understood that while the design method has been described with reference to FIG. 4A, a designer can readily perform a similar design method using an alternative set of plots, such as those shown in FIG. 4B. Additionally, while the design method has been described in conjunction with the selection of a target isolation and width $W_{SHUNT}$, and the determination of a corresponding width $W_{SER}$ and insertion loss, it is understood that a designer can select any combination of either of the widths $W_{SER}$ and $W_{SHUNT}$ and either of a target isolation or a target insertion loss and determine the other of the widths $W_{SER}$ and $W_{SHUNT}$ and the other of the isolation and insertion loss using a similar method and/or similar plots as shown and described herein. Furthermore, additional plots for different gate lengths and/or operating frequencies can be utilized by a designer to design a circuit having any combination of target operating characteristics.

Figure 5:
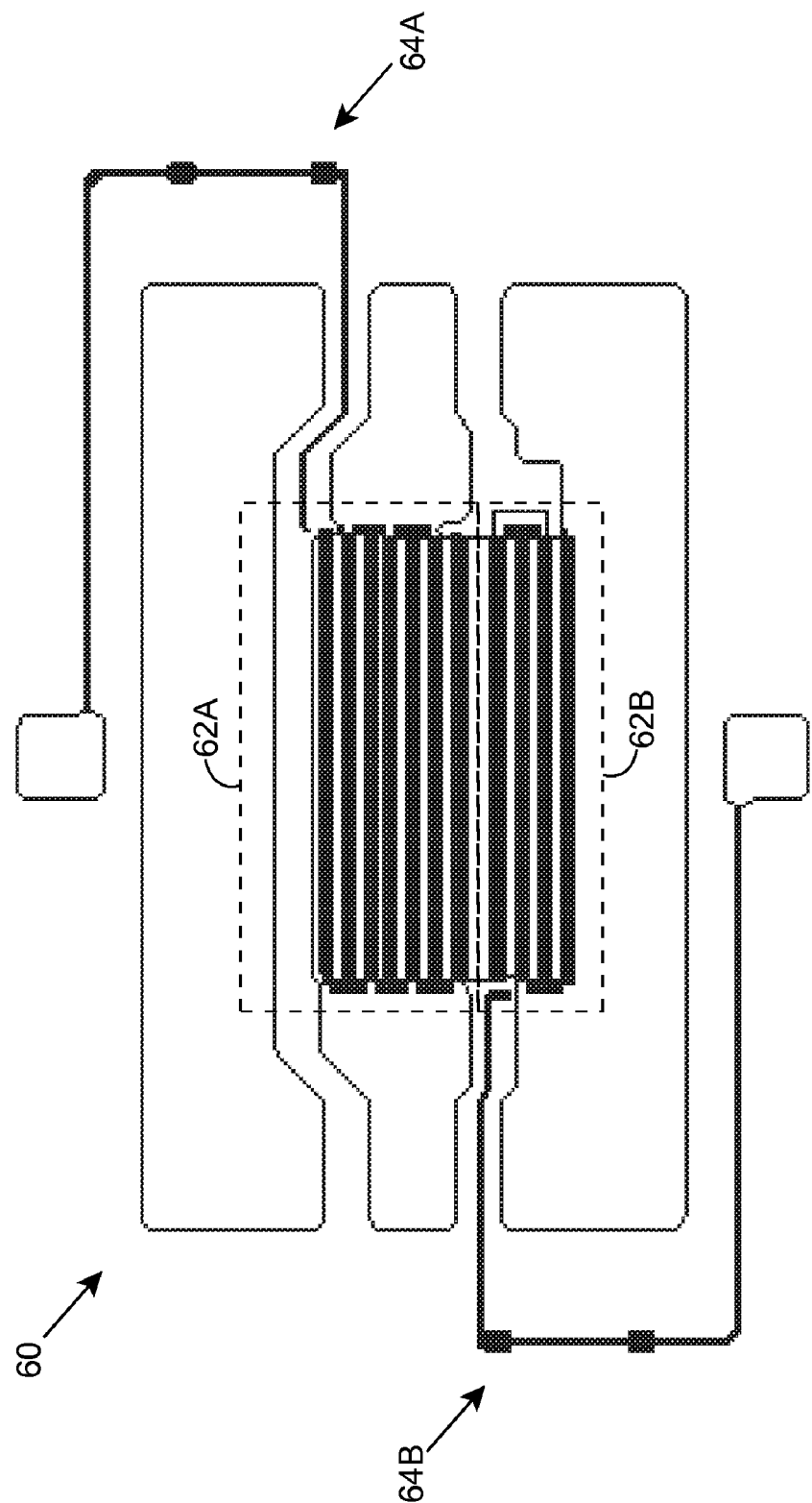
FIG. 5 shows an illustrative integrated circuit layout of a monolithically integrated RF switch according to an embodiment.

An embodiment of the circuit 10 (FIG. 1) can be fabricated using monolithically integrated switching devices 12A, 12B. To this extent, FIG. 5 shows an illustrative integrated circuit layout of a monolithically integrated RF switch 60 according to an embodiment. Switch 60 includes a single main switching device 62A and a single shunt switching device 62B. As illustrated, each switching device 62A, 62B comprises a large-periphery, multi-finger FET. Additionally, the gate of each switching device 62A, 62B is monolithically integrated with a gate control circuit element 64A, 64B, respectively. In an embodiment, each switching device 62A, 62B comprises a group-III nitride-based HFET (e.g., AlGaN/GaN), and each gate control circuit element 64A, 64B comprises a configuration similar to gate control circuit element 30 (FIG. 2). The series-shunt combination of devices 64A, 64B can significantly increase the achievable isolation and/or expand an operating frequency range for the RF switch 60. Use of the integrated gate control circuit elements 64A, 64B can enable the biasing network to be optimized for each individual device within the integrated circuit.

While shown and described herein as a method of designing and/or fabricating a semiconductor device, it is understood that aspects of the invention further provide various alternative embodiments. For example, in one embodiment, the invention provides a method of designing and/or fabricating a circuit that includes one or more of the semiconductor devices designed and fabricated as described herein.

To this extent, FIG. 6 shows an illustrative flow diagram for fabricating a circuit 126 according to an embodiment. Initially, a user can utilize a device design system 110 to generate a device design 112 using a method described herein. The device design 112 can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122. The circuit design 122 can include a device designed using a method described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed using a method described herein.

In another embodiment, the invention provides a device design system 110 for designing and/or a device fabrication system 114 for fabricating a semiconductor device 116 by applying the method described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated using a method described herein. In this case, the system 120, 124 can comprise a general purpose computing device, which is programmed to implement a method of designing and/or fabricating the circuit 126 including at least one semiconductor device 116 as described herein.

For example, using the RF coplanar waveguide circuit 10 of FIG. 1 as an illustrative example, aspects of the invention provide a method and/or system of manufacturing a device including a radio frequency switch. In an embodiment, circuit 10 is fabricated with FET 12A and FET 12B implemented using a monolithically integrated gate control circuit element as described herein. In this case, the method includes electrically connecting a RF signal source to a source contact of the series FET 12A, electrically connecting a RF signal output to a drain contact of the series FET 12A, and electrically connecting an output signal of an element of the gate control circuit 14A or an input signal for the gate control circuit to the monolithically integrated gate control circuit element of the series FET 12A. Similarly, the method can include electrically connecting the RF signal output to a source contact of the series FET 12B, electrically connecting a ground for the circuit 10 to a drain contact of the shunt FET 12B, and electrically connecting an output signal of an element of the gate control circuit 14B or an input signal for the gate control circuit to the monolithically integrated gate control circuit element of the shunt FET 12B.

Illustrative devices include radars, detectors, power amplifiers, rectifiers, wireless communication units, all types of power converters, and/or the like. To this extent, aspects of the invention provide a method of operating a device including a radio frequency switch that includes selectively enabling a radio frequency signal to pass from a source contact of a FET, such as FET 12A or 12B, to a drain contact of the FET 12A, 12B by applying, for the corresponding gate control circuit 14A, 14B, respectively, an output signal of an element thereof or an input signal thereof to the monolithically integrated gate control circuit element of the corresponding FET 12A, 12B.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A switch circuit comprising:
   a field effect transistor (FET);
   a gate control circuit for operating the FET, wherein the gate control circuit includes a gate control circuit element monolithically integrated with the FET, wherein the gate control circuit element comprises first and second contacts to an ungated portion of a channel of the FET, wherein the first contact is monolithically integrated with a gate of the FET and the second contact is electrically connected to another element of the gate control circuit; and
   a low-pass filter formed using the gate control circuit element.

2. The circuit of claim 1, wherein the FET is electrically connected between an input signal and an output signal of the circuit.

3. The circuit of claim 1, wherein the FET is electrically connected between an output signal and a ground signal for the circuit.

4. The circuit of claim 1, wherein the low-pass filter is further formed by a gate-to-channel capacitance of the FET in series with the gate control circuit element.

5. The circuit of claim 1, wherein the FET comprises a heterostructure FET comprising a set of layers of materials selected from one of: the group-III nitride material system or the group-III arsenide material system.

6. The circuit of claim 1, wherein the FET comprises an insulated gate heterostructure FET.

7. The circuit of claim 1, further comprising a second FET, wherein one of the FET or the second FET comprises a series FET and the other of the FET or the second FET comprises a shunt FET.

8. The circuit of claim 7, wherein each of the FET and the second FET comprises a large-periphery, multi-finger FET.

9. The circuit of claim 1, wherein the switch circuit is formed using discrete components.

10. A method comprising:
    designing a switch circuit, the switch circuit including a series field effect transistor (FET) and a shunt FET, the designing including:
      selecting a FET comprising a monolithically integrated gate control element for implementing at least one of: the series FET or the shunt FET, wherein a low-pass filter is formed using the monolithically integrated gate control element; and
      electrically connecting an input signal to an input of the monolithically integrated gate control element, wherein the input signal comprises one of: an output signal of a second gate control element of a gate control circuit or an input signal for the gate control circuit.

11. The method of claim 10, wherein the designing further includes selecting one of: a width of the series FET or a width of the shunt FET based on a selected other of: the width of the series FET or the width of the shunt FET and at least two of: a target insertion loss for the switch circuit, a target isolation for the switch circuit, or a target operating frequency for the switch circuit.

12. The method of claim 11, wherein the selecting includes:
- selecting at least one width of the shunt FET and the target operating frequency for the switch circuit;
- determining, for each selected at least one width of the shunt FET, a dependence of an insertion loss for the switch circuit and an isolation for the switch circuit for the width of the series FET; and
- selecting at least one of: the width of the series FET or the width of the shunt FET based on at least one of: a target insertion loss for the switch circuit or a target isolation for the switch circuit.

13. The method of claim 11, the method further comprising fabricating the switch circuit, wherein the fabricating includes:
- implementing the series FET using a FET having approximately the selected width of the series FET; and
- implementing the shunt FET using a FET having approximately the selected width of the shunt FET.

14. A device comprising:
a field effect transistor (FET) comprising a gate; and
a circuit element monolithically integrated with the gate of the FET, wherein a low-pass filter is formed using the monolithically integrated circuit element, wherein the monolithically integrated circuit element includes a contact for electrically connecting the gate to a gate control circuit, and wherein the device is a discrete component for inclusion in a circuit.

15. The device of claim 14, wherein the monolithically integrated circuit element comprises first and second contacts to an ungated portion of a channel of the FET, wherein the first contact is monolithically integrated with the gate of the FET.

16. The device of claim 14, wherein the monolithically integrated circuit element comprises an on-chip spiral inductor, wherein a first end of the inductor is monolithically integrated with the gate of the FET.

17. The device of claim 14, wherein the FET comprises a heterostructure FET comprising a set of layers of materials selected from the group-III nitride material system.

18. The device of claim 14, wherein the FET comprises a heterostructure FET comprising a set of layers of materials selected from the group-III arsenide material system.

19. The device of claim 14, wherein the FET comprises an insulated gate heterostructure FET.

20. The device of claim 14, wherein the device consists essentially of the FET and the monolithically integrated circuit element.

* * * * *